United States Patent
Tanaka

(10) Patent No.: US 7,483,468 B2
(45) Date of Patent: Jan. 27, 2009

(54) MULTIPLE WAVELENGTHS SEMICONDUCTOR LASER DEVICE

(75) Inventor: Akira Tanaka, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 11/627,516

(22) Filed: Jan. 26, 2007

(65) Prior Publication Data

US 2007/0177648 A1 Aug. 2, 2007

(30) Foreign Application Priority Data

Jan. 27, 2006 (JP) .............................. 2006-018647

(51) Int. Cl.
*H01S 5/00* (2006.01)
(52) U.S. Cl. .............................. 372/50.121; 372/50.12; 372/50.1
(58) Field of Classification Search ............ 372/50.121, 372/50.12, 50.1, 50.122
See application file for complete search history.

(56) References Cited

U.S. PATENT DOCUMENTS

| | | | | |
|---|---|---|---|---|
| 4,925,811 | A | * 5/1990 | Menigaux et al. | ............. 438/33 |
| 5,631,918 | A | * 5/1997 | Kovacs et al. | .................. 372/36 |
| 5,982,799 | A | 11/1999 | Bour et al. | |
| 6,456,635 | B1 * | 9/2002 | Shiomoto et al. | ............. 372/36 |
| 6,771,586 | B2 | 8/2004 | Fujii | |
| 2001/0050531 | A1 | 12/2001 | Ikeda | |
| 2003/0071109 | A1 | 4/2003 | Arikado | |
| 2005/0041700 | A1 | 2/2005 | Tsunoda | |
| 2006/0062267 | A1 | 3/2006 | Tanaka | |

* cited by examiner

*Primary Examiner*—Minsun Harvey
*Assistant Examiner*—Kinam Park
(74) *Attorney, Agent, or Firm*—Banner & Witcoff, Ltd

(57) ABSTRACT

In one aspect of the present invention, a multiple wavelengths semiconductor laser device may include a supporting member, a first semiconductor laser element provided on a first substrate, mounted on the supporting member as face up, and configured to emit a first wavelength laser, and a second semiconductor laser element provided on a second substrate which has lower heat conductivity ratio than the first substrate, mounted on the supporting member as face down, and configured to emit a second wavelength laser toward in substantially a same direction as the first wavelength laser, and in another aspect of the invention, a multiple wavelengths semiconductor laser device may include a supporting member, a first semiconductor laser element provided on a first substrate, mounted on the supporting member as face up, and configured to emit a first wavelength laser, a second semiconductor laser element provided on a second substrate which has lower heat conductivity ratio than the first substrate, mounted on the supporting member as face down, and configured to emit a second wavelength laser in substantially a same direction as the first wavelength laser, and a third semiconductor laser element provided on the second substrate, as face down, and configured to emit a third wavelength laser in substantially a same direction as the first wavelength laser.

18 Claims, 7 Drawing Sheets

MULTIPLE WAVELENGTHS SEMICONDUCTOR LASER DEVICE

CROSS REFERENCE TO RELATED APPLICATION

This application is based upon and claims the benefit of priority from Japanese Patent Application No. P2006-18647, filed on Jan. 27, 2006, the entire contents of which are incorporated herein by reference.

BACKGROUND

Research and development of a semiconductor laser device having a 400 nm wavelength for next generation DVDs is proceeding.

On the other hand, a semiconductor laser device having 650 nm band and 780 nm band wavelengths is used for recording and reading current generation DVDs and CDs. For purposes herein, a semiconductor laser device that generates two or more bands of wavelengths is referred to as a multiple wavelengths semiconductor laser device.

It is difficult to form a multiple semiconductor laser device, which is capable of emitting 400 nm, 650 nm, and 780 nm, on single a semiconductor substrate.

SUMMARY

Aspects of the invention relate to an improved multiple wavelengths semiconductor laser device.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
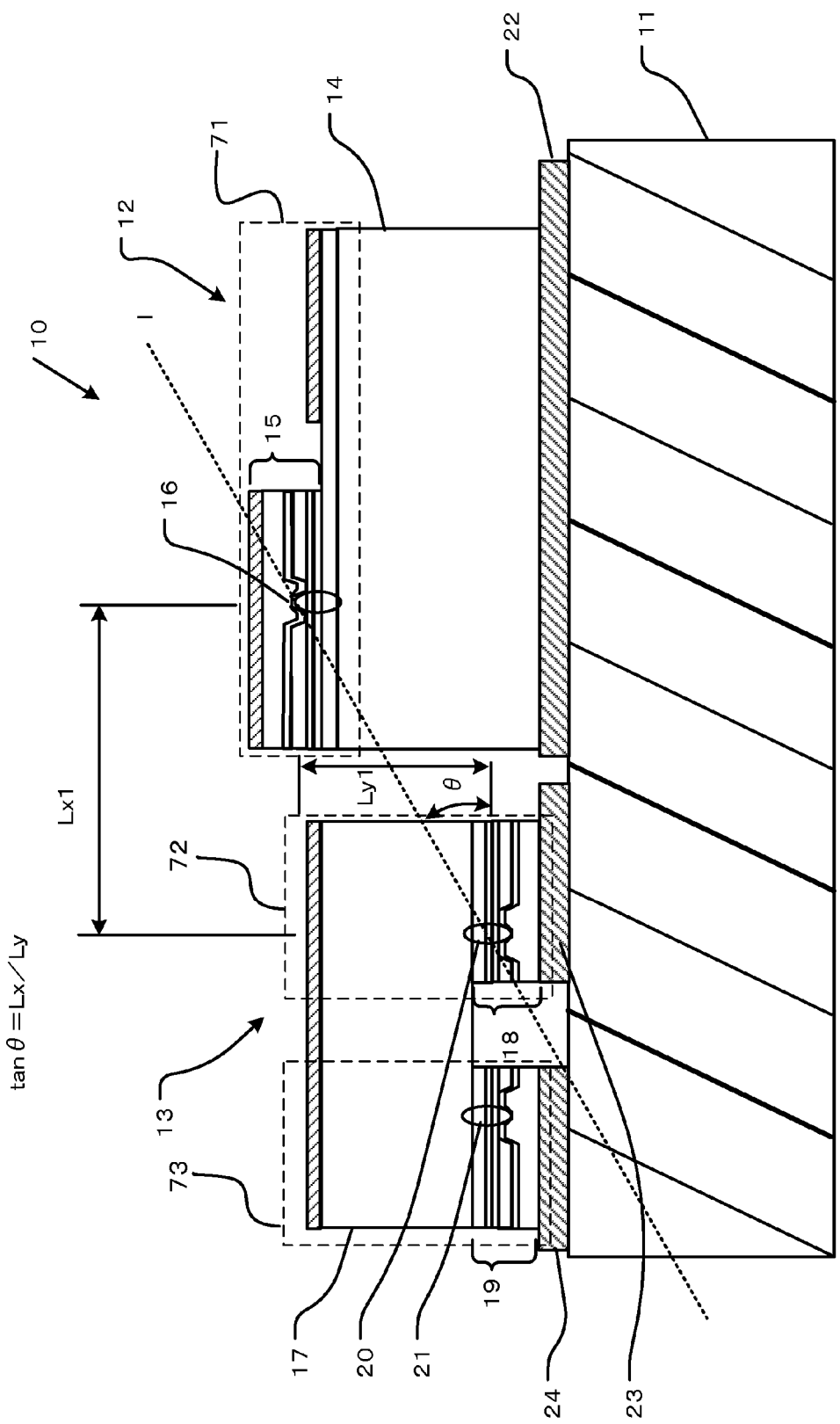
FIG. 1 is a cross sectional view of a multiple wavelengths semiconductor laser device in accordance with a first embodiment.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

Note that the "gallium nitride based semiconductor" used herein includes semiconductors having any composition represented by the chemical formula $B_xIn_yAl_zGa_{1-x-y-z}N$ ($0 \leq x \leq 1$, $0 \leq y \leq 1$, $0 \leq z \leq 1$, $x+y+z \leq 1$) where the composition ratios x, y and z are varied in the respective ranges. Furthermore, the "gallium nitride based semiconductor" also includes those further containing any of various impurities added for controlling conductivity types.

Embodiments of the present invention will be explained with reference to the drawings as follows.

GENERAL OVERVIEW

In one aspect of the present invention, a multiple wavelengths semiconductor laser device may include a supporting member; a first semiconductor laser element provided on a first substrate, mounted on the supporting member as face up, and configured to emit a first wavelength laser; and a second semiconductor laser element provided on a second substrate which has lower heat conductivity ratio than the first substrate, mounted on the supporting member as face down, and configured to emit a second wavelength laser toward in substantially a same direction as the first wavelength laser.

In another aspect of the invention, a multiple wavelengths semiconductor laser device may include a supporting member; a first semiconductor laser element provided on a first substrate, mounted on the supporting member as face up, and configured to emit a first wavelength laser; a second semiconductor laser element provided on a second substrate which has lower heat conductivity ratio than the first substrate, mounted on the supporting member as face down, and configured to emit a second wavelength laser in substantially a same direction as the first wavelength laser; and a third semiconductor laser element provided on the second substrate, as face down, and configured to emit a third wavelength laser in substantially a same direction as the first wavelength laser.

FIRST EMBODIMENT

A first embodiment of the present invention will be explained hereinafter with reference to FIGS. 1-5.

In a multiple wavelengths semiconductor laser device 10, a first semiconductor laser chip 12 and a second semiconductor laser chip 13 are provided. The first semiconductor laser chip 12 is mounted on a supporting member 11 via a solder 22 as face up (junction up). The second semiconductor laser chip 13 is mounted on the supporting member 11 via solders 23 and 24 as face down (junction down).

The first semiconductor laser chip 12 is configured to emit a single wavelength laser, such as in the 400 nm band, and the second semiconductor laser chip 13 is configured to emit two lasers having wavelengths such as in the 650 nm band and 780 nm band. A first semiconductor laser element 71 is provided in the first semiconductor laser chip 12. A second semiconductor laser element 72 and a third semiconductor laser element 73 are provided in the second semiconductor laser chip 13.

The following description includes the terms "face up" and "face down." These terms relate to the orientation of a semiconductor element. In general, a semiconductor element has two opposite surfaces: one is a top surface and the other is a bottom surface. For reference, the bottom surface is a surface on which a substrate is at least initially provided. The surface may be called the bottom surface, even if the substrate is removed after semiconductor layers are grown.

"Face up" may be an orientation of the semiconductor element such that the top surface is farther from a supporting member than the bottom surface of the semiconductor element and such that the bottom surface of the semiconductor element is nearer to the supporting member than the top surface of the semiconductor element.

"Face down" may be an orientation of the semiconductor element such that the top surface is nearer to a supporting member than the bottom surface and such that the bottom surface is farther from a supporting member than the top surface of the semiconductor element.

The supporting member 11 may be insulating submount. The supporting member 11 may be made of ceramics such as AlN or SiC. The supporting member 11 may be functioned as a heat sink, which dissipates a heat to outward from the first semiconductor laser chip 12 and the second semiconductor laser chip 13.

The first semiconductor laser element 71 is an edge emitting laser element. The first semiconductor laser element 71 is provided on an insulating GaN substrate 14. The first semiconductor laser element 71 is configured to emit a laser from a first emission region 16.

For example, the insulating GaN substrate 14 may have a highly doped Zn.

The second semiconductor laser element 72 and the third semiconductor laser element 73 are edge emitting laser elements, respectively. The second semiconductor laser element 72 and the third semiconductor laser element 73 are monolithically provided on a conductive GaAs substrate 17.

The second semiconductor laser element 72 is configured to emit a laser from a second emission region 20, and the third semiconductor laser element 73 is configured to emit a laser from a third emission region 21. The second semiconductor laser element 72 and the third semiconductor laser element 73 are configured to emit laser in substantially the same direction.

The first semiconductor laser chip 12 and the second semiconductor laser chip 13 are mounted on the supporting member 11 such that the first semiconductor laser element 71, the second semiconductor laser element 72, and the third semiconductor laser element 73 are configured emit laser in substantially the same direction.

A line "1" from an emission region 16 of the first semiconductor laser element 71 to an emission region 20 of the second semiconductor laser element 72 may be angled by 20-50 degrees from the bottom surface of the supporting member 11 in order to reduce optical interference. The angle θ may correspond to an angle from bottom surface of the supporting member 11 to the line "1".

It may be necessary that the laser beam is irradiated on a record media, such as disc with a long axis of the laser beam being inclined to a circumference direction of track on the record media. In the semiconductor laser element, the beam shape may be elliptic with its long axis is identical to a vertical direction of a semiconductor substrate of semiconductor chip. In case the long axis of the laser beam is identical to a circumference direction of track on the record media, at least a part of the laser beam may be irradiated on the neighboring track which is written by laser and may be noise. So the line "1" may be preferably angled by 20-50 degrees from a bottom surface of the supporting member 11.

In order to obtain 30 degree as angle θ, a lateral distance "Lx1" from the first emission center 16 to the second emission center 20 is 110 μm, a vertical distance "Ly1" from the first emission center 16 to the second emission center 20 is 64 μm. The distance "Ly1" may be controlled by thinning the thickness of the GaN substrate 14, for instance.

The first semiconductor laser element 71 may be mounted on the supporting member 11 as face up and the second semiconductor laser element 72 is mounted on the supporting member 11 as face down. This is because the GaN substrate 14 has a higher heat conductivity index than the GaAs substrate 17. The heat conductivity ratio of the GaN substrate 14 is 1.3 W/cm·K, and the heat conductivity ratio of the GaAs substrate 17 is 0.5 W/cm·K.

The 400 nm band semiconductor laser element may be formed using other semiconductor substrates, such as Si substrate. These semiconductor substrates also have high heat conductivity The Si substrate has about 1.4 W/cm·K. Thus, it is preferable that the semiconductor laser element, which is configured to emit shorter wavelength, is mounted on the supporting member 11 as face up.

Figure 2A:
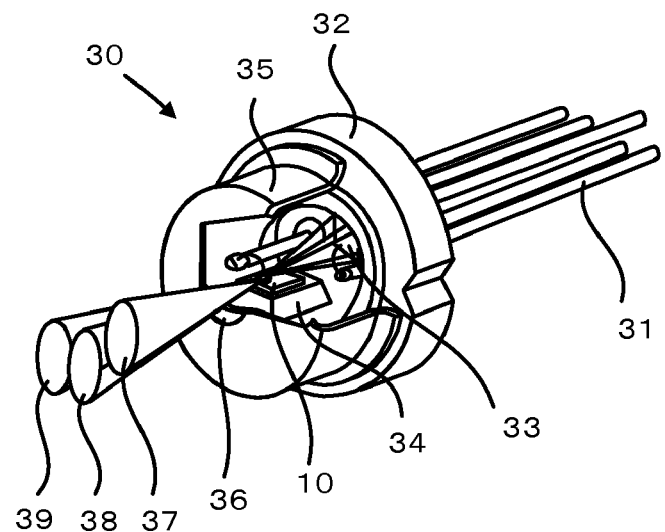
FIG. 2A is a perspective view of a multiple wavelengths semiconductor laser apparatus, in which a multiple wavelengths semiconductor laser device is provided.
Figure 2B:
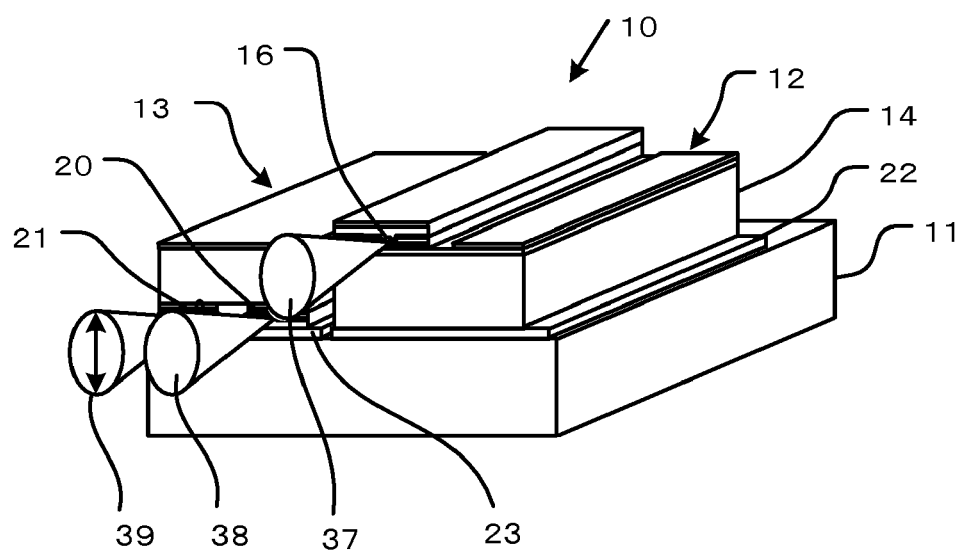
FIG. 2B is a perspective view of a multiple wavelengths semiconductor laser device.

FIG. 2A is a perspective view of a multiple wavelengths semiconductor laser device 30 provided in an enclosure, and FIG. 2B is a perspective view of the multiple wavelengths semiconductor laser device 30.

As shown in FIG. 2A, in the multiple wavelengths semiconductor laser apparatus 30, five lead pins 31 are extended from a stem 32 outward.

The multiple wavelengths semiconductor laser device 10 is mounted on a mount base 34 and provided on the stem 32. A photodiode 33 for monitoring rear laser of the multiple wavelengths semiconductor laser device is provided on the rear side of the multiple wavelengths semiconductor laser device 10 and provided on the stem 32.

The multiple wavelengths semiconductor laser device 10 and the photodiode 33 are electrically connected to the lead pin 31 via wirings.

A cap 35 made of metal is attached on the stem 32 with enclosing the multiple wavelengths semiconductor laser device 10 and the photodiode 33. A window glass 36, which a laser from the multiple wavelengths semiconductor laser device 10 is passed through, is provided on top of the cap 35.

A laser from front surface of the multiple wavelengths semiconductor laser device 10 is emitted via the window glass 36 and a laser from rear surface of the multiple wavelengths semiconductor laser device 10 is emitted toward the photodiode 33.

As shown in FIG. 2B, the first semiconductor laser chip 12 is mounted on the supporting member (insulating submount) 11 as face up with the solder 22 provided on the bottom surface of the GaN substrate 14 being adhered on the supporting member 11.

The second semiconductor laser chip 13 is mounted on the supporting member 11 as face down with the solders 23 and 24 provided on the top surface of the second semiconductor laser chip 13 being adhered on the supporting member 11.

Figure 3:
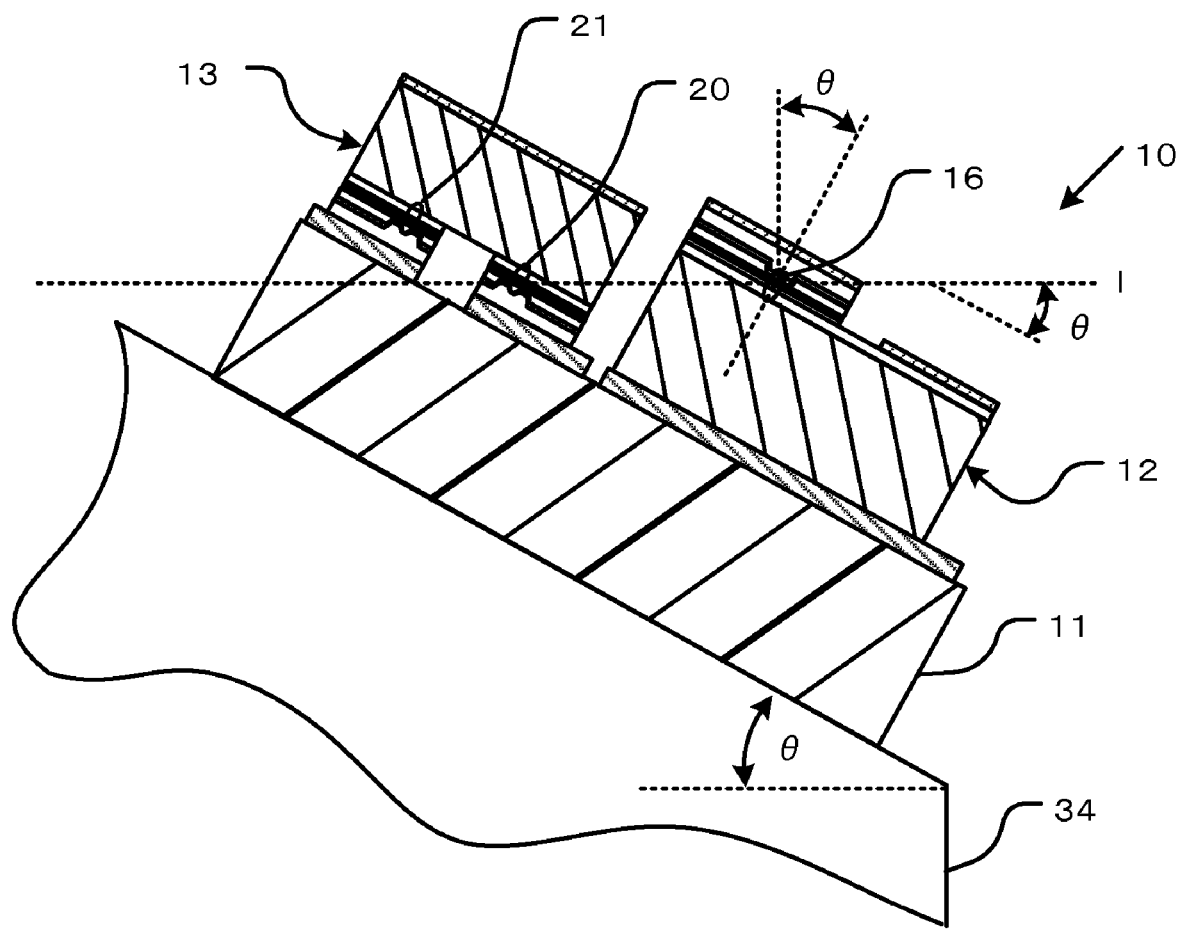
FIG. 3 is a cross sectional view of a multiple wavelengths semiconductor laser device mounted on a stem of the enclosure.

FIG. 3 is a cross sectional view of the multiple wavelengths semiconductor laser device 10 mounted on mount base 34 of the stem 32.

As shown in FIG. 3, the top surface of the mount base 34 is angled θ from a reference surface (bottom surface) of the stem 32. So the line "1", which is the line from the emission region 16 of the first semiconductor element 71 and the emission region 20 of the second semiconductor laser element 72, is substantially parallel to reference surface of the stem 32.

So the long axis of the 400 nm laser beam 37, the long axis of the 650 nm laser beam 38, and the long axis of the 780 nm laser 39 are angled θ from the vertical direction of the reference surface of the stem 32.

Figure 4:
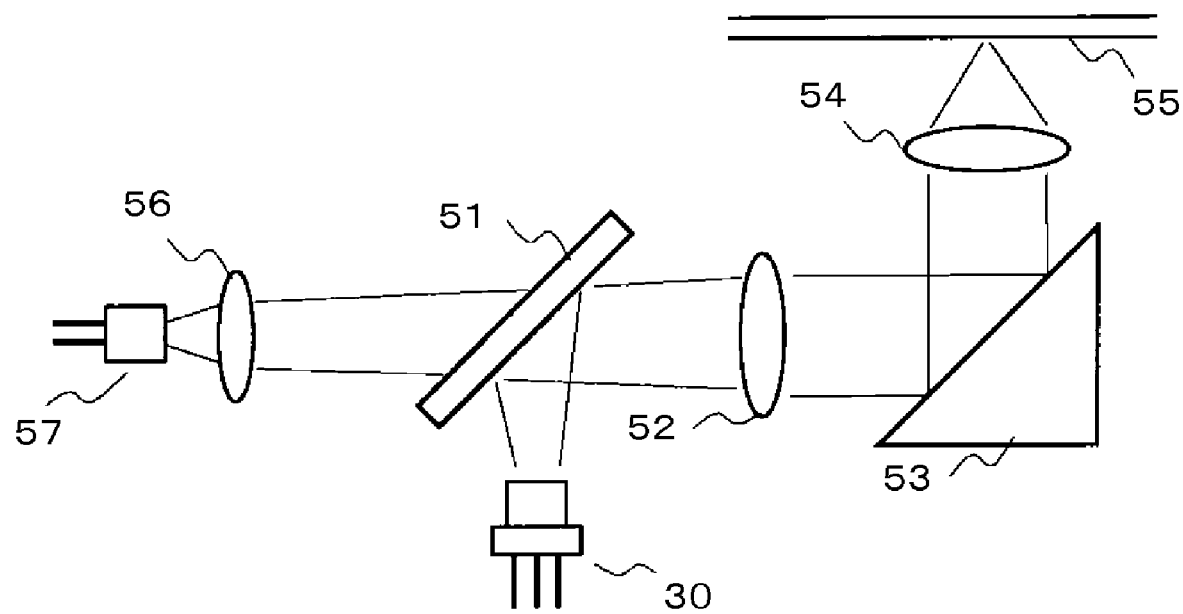
FIG. 4 is a schematic view of a pickup head with the multiple wavelengths semiconductor laser device.

FIG. 4 is a schematic view of a pickup head applied the multiple wavelengths semiconductor laser device.

When data is recorded on a disc 55, the laser beam from the multiple wavelengths semiconductor laser apparatus 30 is emitted to a half mirror 51 and reflected toward collimate lens 52, and parallel light is created.

The laser beam is emitted to a mirror 53 and reflected to objective lens 54. At the objective lens 54, the laser beam is focused so as to write data on the disc 55.

When data is read from the disc, a low power laser beam is emitted toward the disc 50 from the multiple wavelengths semiconductor laser apparatus 30 as similar to the recording process. The laser beam reflected from the disc 55 is read via objective lens 54, the mirror 53, collimate lens 52, the half mirror 51 and a hologram element 56, and focused on a photo detector 57. So the data recorded on the disc 55 is read.

Recording and reading to/from the next generation DVD, DVD-R/ -RW/-ROM and CD-R /-RW /-ROM may be available by the multiple wavelengths semiconductor laser apparatus.

Figure 5A:
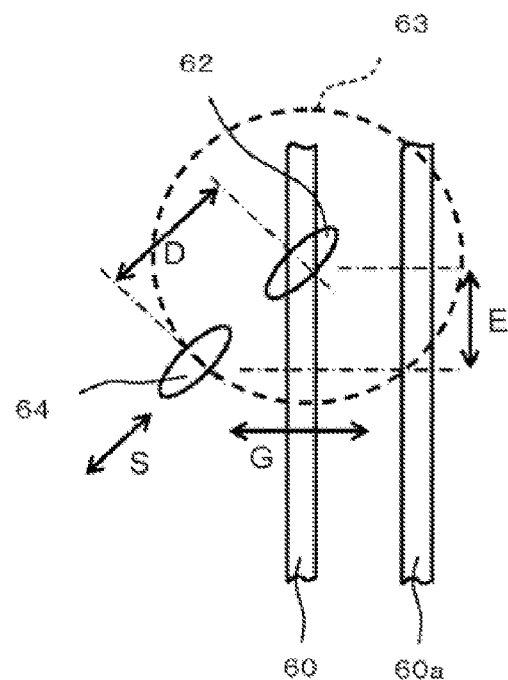
FIG. 5A is a schematic view showing a position of beams on a disc emitted from a conventional multiple wavelengths semiconductor laser device.
Figure 5B:
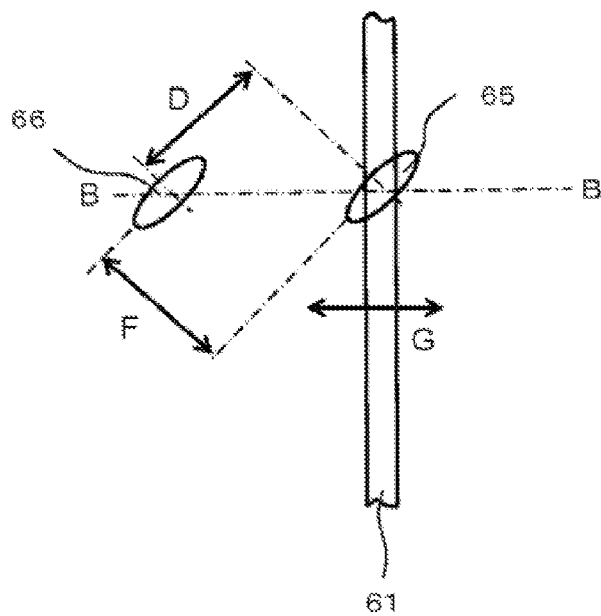
FIG. 5B is a schematic view showing a position of beams on a disc emitted from a multiple wavelengths semiconductor laser device of the first embodiment.

FIGS. 5A and 5B are schematic views for explaining a function of the semiconductor laser array of the first embodiment. FIG. 5A is a schematic view showing a position of beams on a track 60 on an optical disc. In a writable DVD recorder, to avoid noise of a servo signal from reflection by a next track (pit row) 60a, a spread direction "S" of the beam spot 62 for DVD is angled from a tracking direction "G," such as by 10-80 degrees. However, in the case of the conventional multi-wavelength laser, if the emission centers of the beams are positioned on a single plane, such that the spread direction of both beams coincides, the beams are irradiated by an objective lens 63 spaced by distance "D" vertically and distance "E" horizontally. Generally, however, objective lens 63 follows along the direction "G". So, as the beam spot 64 for CD is spaced by distance "E" from the center of objective lens 157, an actuator of objective lens 157 does not adjust the lens position.

FIG. 5B is a schematic view showing a position of beams on a track 61 on an optical disc. The beam for DVD (shown in FIG. 6) is focused to beam spot 65 and the beam for CD (shown in FIG. 6) is focused to beam spot 66. Between beam spots 65 and 66, the distance "D" occurs corresponding to the horizontal distance between emission centers 16 and 20 and a distance "F" occurs corresponding to the vertical distance between emission centers 16 and 20. However, by designing suitable vertical and horizontal distances between emission centers 16 and 20, the deviation along the longitudinal direction "G" of track 61 is revisable. By moving objective lens 63 toward "G", the centers of the beams are positioned near the center of the objective lens 63. As a result, objective lens 63 is capable of following to both beams. The line "B-B" in FIG. 5B corresponds to the line "1" in FIG. 1.

In this embodiment, a first semiconductor laser element 71 configured to emit a first wavelength laser is mounted on the supporting member 11 as face up, and a second semiconductor laser element 72, which is provided on a lower heat conductivity substrate than the first semiconductor laser element 71, is mounted on the supporting member 11 as face down, and configured to emit a second wavelength laser in substantially same direction as the first wavelength laser. So the angle θ may be controllable by changing the thickness of the semiconductor substrate of the first semiconductor laser element 71, and heat dissipation from the multiple wavelengths semiconductor laser device 10 may be improved.

In this embodiment, the second semiconductor laser element 72 and the third semiconductor laser element 73 are formed on the GaAs substrate monolithically. However, the second semiconductor laser element 72 and the third semiconductor laser element 73 may be formed on the semiconductor substrate separately.

SECOND EMBODIMENT

A second embodiment is explained with reference to FIG. 6.

A multiple wavelength semiconductor laser device 130 is described in accordance with a second embodiment of the present invention. With respect to each portion of this embodiment, the same or corresponding portions of the multiple wavelength semiconductor laser device of the first embodiment shown in FIGS. 1-5 are designated by the same reference numerals, and explanation of such portions is omitted. In this second embodiment, three semiconductor laser elements are high optical output lasers.

Figure 6:
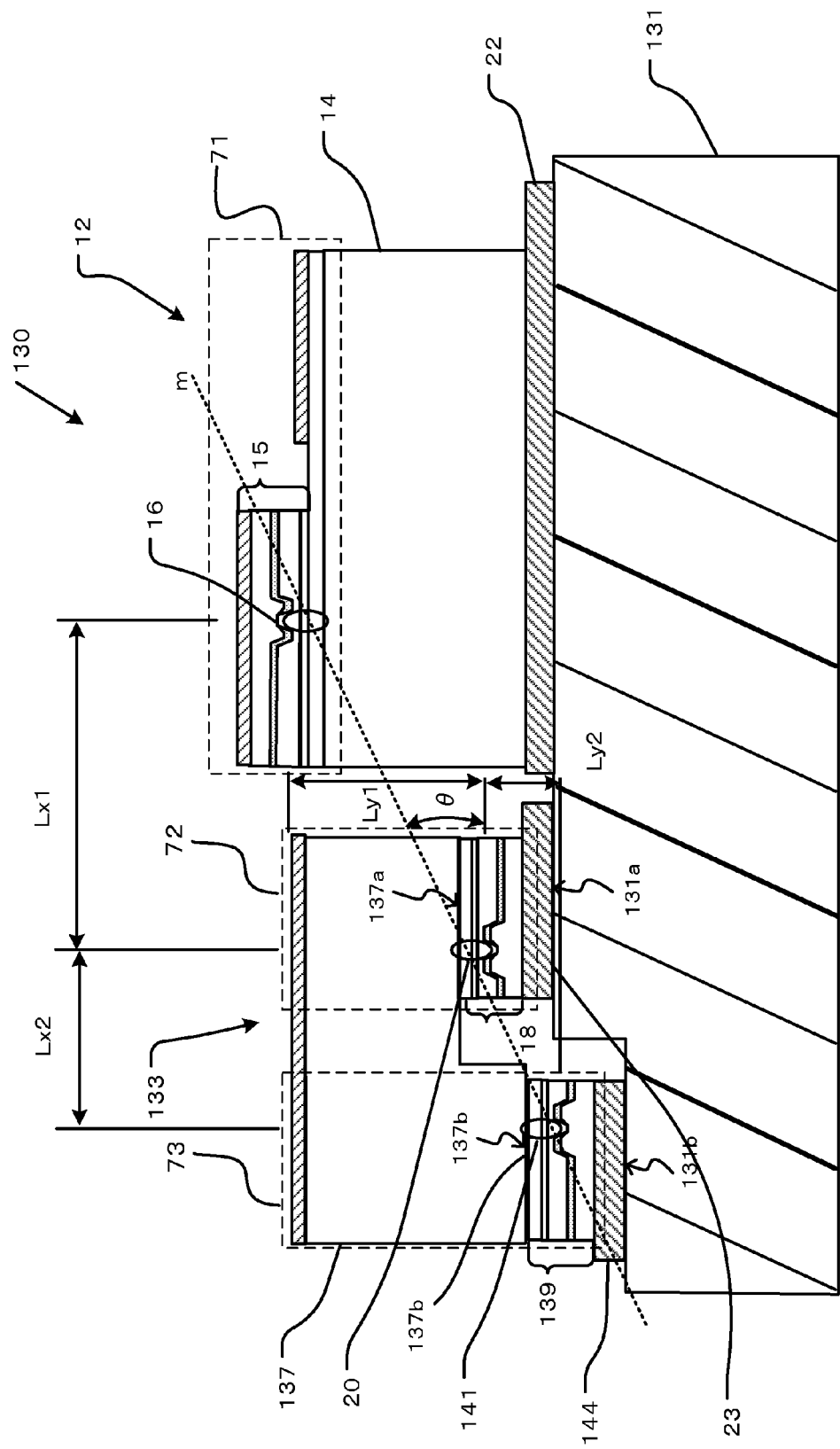
FIG. 6 is a cross sectional view of a multiple wavelengths semiconductor laser device in accordance with a second embodiment.

As shown in FIG. 6, in the multiple wavelength semiconductor laser device 130, the first semiconductor laser chip 12 is mounted on a supporting member 131 as face up, a second semiconductor laser chip 133 is mounted on the supporting member 131 as face down. The first semiconductor laser element 71 is provided in the first semiconductor laser chip 12.

The second semiconductor laser element 72 is configured to emit 650 nm band laser and the third semiconductor laser element 73 is configured to emit 780 nm band laser.

The second semiconductor laser element 72 and the third semiconductor element 73 is provided on a GaAs substrate 137 monolithically in the second semiconductor laser chip 133. The first semiconductor laser element 71, the second semiconductor laser element 72 and the third semiconductor laser element 73 are configured emit laser in substantially the same direction.

In the second semiconductor laser chip 133, N type GaAs substrate 137 has a step on its top surface (lower surface in FIG. 6). Semiconductor lamination 18 of the second semiconductor laser element 72 is provided on a lower portion 137a of the step. Semiconductor lamination 139 of the third semiconductor laser element 73 is provided on the upper portion 137b of the step.

The supporting member 131 has a step, which is corresponding to the step in the second semiconductor laser chip 133. The first semiconductor laser chip 12 is mounted on the upper portion 131a of the supporting member 131 as face up via the solder 22.

The second semiconductor laser element 72 is mounted on the upper portion 131a of the supporting member 131, and the third semiconductor laser element 73 is mounted on the lower portion 131b of the supporting member 131.

As shown in FIG. 6, the emission region 16 of the first semiconductor element 16, the emission region of the second semiconductor element 20, and a third emission region of the third semiconductor element 141 are provided on a single line "m".

When the angle θ which is identical to the angle from the bottom surface of the supporting member 131 and the line "m" is 30 degree and the distance "Lx2", which is from the second emission region 20 to third emission region 141 is 110 micrometers, the height "Ly2" of the step is designed so as to be 64 micrometers.

The chance that the laser emitted from the second semiconductor laser element 72 and the laser emitted from the third semiconductor laser element 73 optically interfere with each other is reduced, since the second emission region of the second semiconductor laser element 72 and the third emission region of the third semiconductor laser element 73 are provided along line "m".

In this embodiment, the multiple wavelengths semiconductor laser device having a high heat dissipation and low optical interference may be obtained.

THIRD EMBODIMENT

A third embodiment is explained with reference to FIG. 7.

A multiple wavelength semiconductor laser device 150 is described in accordance with a third embodiment of the present invention. With respect to each portion of this embodiment, the same or corresponding portions of the multiple wavelength semiconductor laser device of the first or second embodiment shown in FIGS. 1-6 are designated by the same reference numerals, and explanation of such portions is omitted. In this second embodiment, the second semiconductor laser chip 13 is provided on the first semiconductor laser chip 12.

Figure 7:
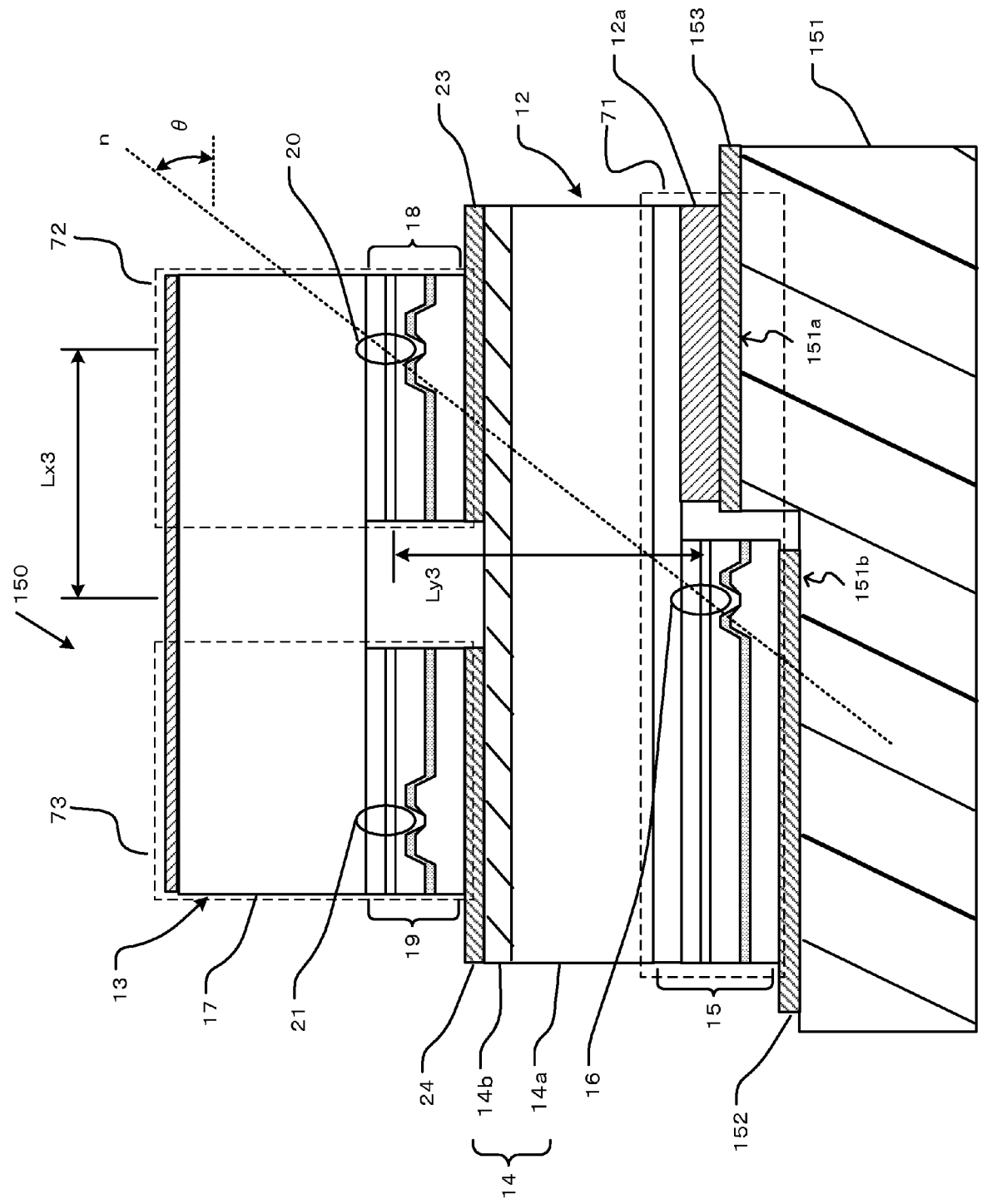
FIG. 7 is a cross sectional view of a multiple wavelengths semiconductor laser device in accordance with a third embodiment.

As shown in FIG. 7, the first semiconductor laser chip 12 is mounted on a supporting member 151 as face down. The second semiconductor laser chip 13 is mounted on the first semiconductor laser chip 12 as face down.

The supporting member 151 has a step, which is corresponding to the step in the first semiconductor laser chip 12. A P side electrode of the first semiconductor laser element 71 is provided on the lower portion 151b of the supporting member 151. An N side electrode 12a of the first semiconductor laser element 71 is provided on the upper portion 151a of the supporting member 151.

When the angle θ which is identical to the angle from the bottom surface of the supporting member 151 and the line "n" is 30 degree and the distance "Lx3", which is from the second emission region 20 to the first emission region 16 is 110 micrometers, the distance "Ly3" is designed so as to be 64 micrometers.

In this embodiment, the bottom surface of the supporting member may be small, since the second semiconductor laser chip is mounted on the first semiconductor laser chip.

In this embodiment, a multiple wavelengths semiconductor laser device may include a supporting member; a first semiconductor laser element provided on a first substrate, mounted on the supporting member as face down, and configured to emit a first wavelength laser; and a second semiconductor laser element provided on a second substrate which has lower heat conductivity ration than the first substrate, mounted on the first semiconductor laser element as face down, and configured to emit a second wavelength laser toward substantially same direction as the first wavelength laser.

Embodiments of the invention have been described with reference to the examples.

However, the invention is not limited thereto.

For example, the material of the semiconductor laser chip is not limited to InGaAlP-based or GaN-based semiconductors, but may include various other Group III-V compound semiconductors such as GaAlAs-based and InP-based semiconductors, or Group II-VI compound semiconductors, or various other semiconductors.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A multiple wavelengths semiconductor laser device, comprising:
   a supporting member;
   a first semiconductor laser element provided on a first substrate, mounted on the supporting member as face up, and configured to emit a first wavelength laser; and
   a second semiconductor laser element provided on a second substrate which has lower heat conductivity ratio than the first substrate, mounted on the supporting member as face down, and configured to emit a second wavelength laser in substantially a same direction as the first wavelength laser,
   wherein a height from the supporting member to an emission region of the first semiconductor laser element is greater than a height from the supporting member to an emission region of the second semiconductor laser element.

2. A multiple wavelengths semiconductor laser device of claim 1, wherein a line from an emission region of the first semiconductor laser element to an emission region of the second semiconductor laser element is angled by 20-50 degrees from a surface of the supporting member.

3. A multiple wavelengths semiconductor laser device of claim 1, wherein the supporting member has a first portion and the second portion thinner than the first portion, and a third semiconductor laser element is mounted on the second portion of the supporting member and the first semiconductor laser element and the second semiconductor laser element are mounted on the first portion of the supporting member.

4. A multiple wavelengths semiconductor laser device of claim 1, wherein the first wavelength laser has a lower peak wavelength than the second wavelength laser.

5. A multiple wavelengths semiconductor laser device, comprising:
   a supporting member;
   a first semiconductor laser element provided on a first substrate, mounted on the supporting member as face up, and configured to emit a first wavelength laser;
   a second semiconductor laser element provided on a second substrate which has lower heat conductivity ratio than the first substrate, mounted on the supporting member as face down, and configured to emit a second wavelength laser in substantially a same direction as the first wavelength laser; and
   a third semiconductor laser element provided on the second substrate, as face down, and configured to emit a third wavelength laser in substantially a same direction as the first wavelength laser,
   wherein a height from the supporting member to an emission region of the first semiconductor laser element is greater than a height from the supporting member to an emission region of the second semiconductor laser element.

6. A multiple wavelengths semiconductor laser device of claim 5, wherein a line from an emission region of the first semiconductor laser element to an emission region of the second semiconductor laser element is angled by 20-50 degrees from a surface of the supporting member.

7. A multiple wavelengths semiconductor laser device of claim 5, wherein a height from the supporting member to an emission region of the second semiconductor laser element is equal to a height from the supporting member to an emission region of the third semiconductor laser element, and a height from the supporting member to an emission region of the first semiconductor laser element is greater than a height from the supporting member to an emission region of the second semiconductor laser element.

8. A multiple wavelengths semiconductor laser device of claim 5, wherein the supporting member has a first portion and the second portion thinner than the first portion, and the third semiconductor laser element is mounted on the second portion of the supporting member and the first semiconductor laser element and the second semiconductor laser element are mounted on the first portion of the supporting member.

9. A multiple wavelengths semiconductor laser device of claim 5, wherein emission regions of the first, second and third semiconductor laser elements are provided on a single line.

10. A multiple wavelengths semiconductor laser device of claim 9, wherein the single line is angled by 20-50 degrees from a surface of the supporting member.

11. A multiple wavelengths semiconductor laser device of claim 5, wherein the first wavelength laser has a lower peak wavelength than the second wavelength laser.

12. A multiple wavelengths semiconductor laser device of claim 7, wherein the first wavelength laser has a lower peak wavelength than the second wavelength laser.

13. A multiple wavelengths semiconductor laser device of claim 5, wherein the first wavelength laser has a lower peak wavelength than the second wavelength laser, and the second wavelength laser has a lower peak wavelength than the third wavelength laser.

14. A multiple wavelengths semiconductor laser device of claim 5, wherein a line from an emission region of the first semiconductor laser element to an emission region of the second semiconductor laser element is angled by 20-50 degrees from a surface of the supporting member.

15. A multiple wavelengths semiconductor laser device of claim 8, wherein emission regions of the first, second and third semiconductor laser elements are provided on a single line.

16. A multiple wavelengths semiconductor laser device of claim 5, wherein the first wavelength laser has a lower peak wavelength than the second wavelength laser.

17. A multiple wavelengths semiconductor laser device of claim 7, wherein the first wavelength laser has a lower peak wavelength than the second wavelength laser, and the second wavelength laser has a lower peak wavelength than the third wavelength laser.

18. A multiple wavelengths semiconductor laser device of claim 8, wherein the first wavelength laser has a lower peak wavelength than the second wavelength laser, and the second wavelength laser has a lower peak wavelength than the third wavelength laser.

* * * * *